US010263506B2

(12) United States Patent
Brueckner et al.

(10) Patent No.: US 10,263,506 B2
(45) Date of Patent: Apr. 16, 2019

(54) CIRCUIT ARRANGEMENT AND METHOD FOR GATE-CONTROLLED POWER SEMICONDUCTOR DEVICES

(71) Applicant: GE Energy Power Conversion Technology Ltd, Warwickshire (GB)

(72) Inventors: Thomas Brueckner, Berlin (DE); Roland Jakob, Berlin (DE)

(73) Assignee: GE ENERGY POWER CONVERSION TECHNOLOGY LTD, Rugby (GB)

( * ) Notice: Subject to any disclaimer, the term of this patent is extended or adjusted under 35 U.S.C. 154(b) by 305 days.

(21) Appl. No.: 15/060,645

(22) Filed: Mar. 4, 2016

(65) Prior Publication Data

US 2016/0261180 A1 Sep. 8, 2016

(30) Foreign Application Priority Data

Mar. 5, 2015 (DE) .......................... 10 2015 103 247

(51) Int. Cl.
*H02M 1/32* (2007.01)
*H03K 17/081* (2006.01)
(Continued)

(52) U.S. Cl.
CPC ............. *H02M 1/32* (2013.01); *H02M 7/537* (2013.01); *H03K 17/0822* (2013.01);
(Continued)

(58) Field of Classification Search
USPC .............................................. 361/8, 62, 93.9
See application file for complete search history.

(56) References Cited

U.S. PATENT DOCUMENTS

| 4,567,537 A | 1/1986 | Kalkhof et al. |
| 4,626,750 A | 12/1986 | Post |

(Continued)

FOREIGN PATENT DOCUMENTS

| EP | 0989611 A2 | 3/2000 |
| EP | 2544229 A1 | 1/2013 |

(Continued)

OTHER PUBLICATIONS

D. Bortis P, et al "Double-stage Gate Drive Circuit for Parallel Connected IGBT Modules", Published in: IEEE International Power Modulators and High Voltage Conference; 388-391, May 2008.

(Continued)

*Primary Examiner* — Danny Nguyen
(74) *Attorney, Agent, or Firm* — GE Global Patent Operation; Scott R. Stanley

(57) ABSTRACT

A switch module includes a collector connection, an emitter connection, and a gate connection. The switch module includes a plurality of parallel connected switching elements, e.g., insulated-gate bipolar transistors, each having a collector electrode electrically connected to the collector connection, an emitter electrode electrically connected to the emitter connection, and a gate electrode electrically connected to the gate connection. A fault protection device is operatively electrically connected between the gate connection and the switching elements and comprises passive electrical components which are selected such that in the event of a fault in at least one of the plurality of switching elements, a gate-emitter voltage is provided to the gate electrodes of non-faulty switching elements in a passive manner.

14 Claims, 7 Drawing Sheets

(51) Int. Cl.
*H03K 17/082* (2006.01)
*H02M 7/537* (2006.01)
*H03K 17/0814* (2006.01)
*H02M 1/088* (2006.01)

(52) U.S. Cl.
CPC ... *H03K 17/0828* (2013.01); *H03K 17/08104* (2013.01); *H03K 17/08116* (2013.01); *H02M 1/088* (2013.01); *H02M 2001/325* (2013.01); *H03K 17/08142* (2013.01); *H03K 17/08148* (2013.01)

(56) References Cited

U.S. PATENT DOCUMENTS

| | | | |
|---|---|---|---|
| 5,986,909 | A | 11/1999 | Hammond et al. |
| 6,097,582 | A | 8/2000 | John et al. |
| 6,275,044 | B1 | 8/2001 | Scott |
| 6,426,561 | B1 | 7/2002 | Lang et al. |
| 8,503,202 | B2 | 8/2013 | Chimento et al. |
| 8,611,113 | B2 | 12/2013 | Asplund |
| 8,614,904 | B2 | 12/2013 | Norrga et al. |
| 8,638,576 | B2 | 1/2014 | Hosini et al. |
| 8,755,206 | B2 | 6/2014 | Nee |
| 2012/0182771 | A1 | 7/2012 | Trainer et al. |
| 2012/0262218 | A1* | 10/2012 | Klaka ............ H03K 17/06 327/383 |
| 2014/0043873 | A1 | 2/2014 | Blomberg |
| 2015/0085415 | A1* | 3/2015 | Wildner ...... H03K 17/08128 361/93.1 |

FOREIGN PATENT DOCUMENTS

| | | |
|---|---|---|
| EP | 2632008 A2 | 8/2013 |
| GB | 1241334 A | 8/1971 |
| JP | 2005051901 A | 2/2005 |
| WO | 2006104430 A1 | 10/2006 |
| WO | 2012123027 A1 | 9/2012 |
| WO | 2012175109 A1 | 12/2012 |
| WO | 2013004289 A1 | 1/2013 |
| WO | 2013004297 A1 | 1/2013 |
| WO | 2013139373 A1 | 9/2013 |
| WO | 2013156078 A1 | 10/2013 |

OTHER PUBLICATIONS

German Office Action issued in Connection with Corresponding DE Application No. 102015103247.3 dated Mar. 5, 2015.
European Search Report and Opinion issued in connection with Corresponding EP Application No. 16157999.0 dated Jul. 11, 2016.

* cited by examiner

CIRCUIT ARRANGEMENT AND METHOD FOR GATE-CONTROLLED POWER SEMICONDUCTOR DEVICES

TECHNICAL FIELD

The present invention relates to a switch module with short circuit failure protection and a power electronic module incorporating such a switch module.

BACKGROUND ART

Switch modules with power semiconductor devices are used in converters for the conversion of direct current (DC) to alternating current (AC) and vice versa, and for many other applications. A switch module represents a controllable part, whose state can be changed by a control signal between a conducting (or on) state and a non-conducting (or off) state. For high performance applications, for example, high voltage-direct current (HVDC) applications, in many multi-level converter topologies, often several switch modules are connected to each other in series. Redundancy requirements, according to which the function of a device must be ensured in case of a failure of one or more switch modules, can require the application of two or more switch modules connected in series.

It is important that a faulty switch module does not influence the functioning of the non-faulty switch modules or the power electronic module as a whole, for instance, a converter. In this respect, it is desirable that in a series of switch modules a faulty switch module can be set in a short circuit failure mode, in which it continuously conducts so that the operation of the power electronic module can be continued with other functionally capable switch modules. In many circuit topologies, for instance, H-bridges, half-bridges etc., is useful if a switch module is moved to a failure mode in a conducting state so that both the alternating voltage connections of an H-bridge can be continuously conductively connected with each other.

A switch module can include a number of power semiconductor devices or switching elements, e.g., insulated-gate bipolar transistors (IGBTs), metal-oxide-semiconductor field-effect transistors (MOSFETs) or other similar devices, which are connected in parallel to each other and switched simultaneously. Thereby the current load can be distributed between several parallel circuits, which enables operation with high current and output. A drive unit is provided in order to feed the switching elements of a switch module with a suitable common control signal on the basis of a control signal from a superior control. The switching elements can be accommodated within a common housing, e.g., a pressure contact housing (so-called press-pack housing). The housing can contain other components like symmetrical resistances in the control circuit in order to achieve symmetry, and to achieve maximum possible simultaneous and equal switching of all the switching elements in the case of external control. The drive unit is normally arranged outside the housing and is connected to one or more terminals that extend out of the switch module housing.

If one of the parallel connected switching elements, for example, an IGBT, suffers a short circuit between its collector electrode and its emitter electrode, and as a result becomes faulty and is destroyed, this generally leads to a short circuit between the gate electrode of the switching element and its emitter electrode. The gate-emitter short circuit of the faulty switching element, due to parallel switching, also shorts the gate electrodes of other, functionally capable switching elements to the emitter electrode and prevents the gate electrodes from maintaining a sufficient voltage so as to remain in a conducting state or to move to a conducting state. Consequently, a control of the functionally capable switching elements is impossible through the gate electrodes.

A failure of a switching element, hereinafter referred to also as a fault, is understood to mean a short circuit of the gate electrode to another electrode, especially the emitter electrode.

Under these conditions, the faulty switching element must conduct the complete load current and manage it. The current load of the faulty switching element with nominal current of the switch module or possible overcurrent, and the associated excessive heating, can lead to destruction of the switch module and also damage the drive unit and other system components. Especially, electric arcs can emerge, which can lead to outage of other components, an explosion of components or fire. This should be prevented. Furthermore, a low Ohm (or low impedance) current path should be installed through the faulty switch module in order to ensure further functional capability of a power electronic module.

In order to avoid a mechanical destruction of the switch module through explosion, the switching elements so far have been protected against explosion by explosion-proof metal housings, which is difficult and expensive. Complex ultra-fast explosive driven mechanical bypass switches are also used for converters. Still further, switch modules are developed which present a stable short circuit failure mode (SCFM) in case of a fault. The SCFM-capability is achieved by placing a metal plate on top of the switching elements of a power electronic module (see e.g., EP 0989611). A failure melts the metal plate and the switching element and forms a conductive metal-silicon alloy, which enables a low Ohm (or low impedance) current path through the switch module. Due to material oxidation, if the electrical resistance of the damaged switching element increases, another electrically parallel connected switching element will be damaged and it melts and forms the next low Ohm (or low impedance) current path. These types of SCFM transitions are continued till all the switching elements are used up. In spite of the high complexity, a continuous and stable short circuit failure mode cannot be ensured.

WO 2006/104430 A1 describes a power converter valve and a control process which uses several parallel connected semiconductor switching elements, whereby to each switching element a separate drive unit is assigned. A fault in one of the switching elements is recorded through a current measurement, and the other, fault-free switching elements are further powered specifically through their associated drive units in order to create a conducting state of the converter valve. The short circuit protection is gained with high circuit and control expenditure.

WO 2013/139373 A1 describes a switch module with a first connection, a second connection, a gate, several switching elements, which are connected to each other in parallel between the first connection, the second connection and the gate, fuses, which are provided between each individual electrodes of several switching elements and the gate, and a bypass switch, which is arranged between the gate and the second connection. If a short circuit fault is identified in a switching element, the bypass switch is triggered and closed in order to branch out a part of the load current flowing through the short circuited switching element and to conduct through the associated fuse, a bypass resistance and bypass switch to the second connection for the switching element in order to melt the fuse. As soon as the fuse melts, the control line to the faulty switching element is broken so that the rest of the switch module remains functional. However, this solution requires an additional active switch within the switch module and an active logic for controlling this additional active switch in case of fault.

Based on this, it is the objective of the invention to create a switch module with several parallel connected switching elements (e.g., power semiconductor devices), which is in a position to achieve at least a limited controllability of all or part of the remaining non-faulty or functionally capable switching elements after a fault in a switch module or in an individual switching element in order to enable a continuously conducting state of the switch module, so as to reduce the danger of an explosion and to create a stable low Ohm (or low impedance) current path through the faulty switch module. This mostly involves simple means and with simple structure, with less expenditure and lower costs with the manufacturing and operation.

Another objective of the present invention is to create a power electronic module with a switch module, which is particularly suitable for high performance application.

SUMMARY OF THE INVENTION

These objectives are solved by providing a switch module according to embodiments of the invention.

Embodiments of the present invention provide a switch module comprising: a first connection (e.g., a collector connection), a second connection (e.g., an emitter connection), and at least one control connection (e.g., a gate connection); a plurality of parallel connected switching elements each having a first electrode (e.g., a collector electrode) electrically connected to the first connection, a second electrode (e.g., an emitter electrode) electrically connected to the second connection, and a control electrode (e.g., a gate electrode) electrically connected to the at least one control connection; and a fault protection device operatively electrically connected between the at least one control connection and the switching elements, wherein the fault protection device comprises passive electrical components which are selected such that in the event of a fault in at least one of the plurality of switching elements, a control voltage (e.g., a gate-emitter voltage) is provided to the control electrodes of non-faulty switching elements in a passive manner, which control voltage is sufficient to switch at least some (and in some cases, all) of the non-faulty switching elements to a conducting state or to maintain them in a conducting state.

Embodiments of the present invention are based on the idea that, in case of a fault in one or more of the switching elements in the switch module, the fault protection device automatically controls at least some of the non-faulty or functionally capable switching elements to switch to a conducting state or maintains them in a conducting state before they are damaged or destroyed as a result of the short circuit fault, e.g., as a result of overcurrent, heat build-up, electric arc etc. This protection is provided in purely passive manner, and in particular without any additional active logic, active control or active switching, and without additional active connections or changeover of current paths or other additional measures. The functionally capable switching elements remain controllable and in a conducting state so that a stable low Ohm (low impedance) current path is created through the switch module and the danger of an explosion and damage being caused is avoided or at least reduced.

In an embodiment, the switching elements are power semiconductor devices, e.g., voltage-controlled power semiconductor devices such as IGBTs, MOSFETS and junction field effect transistors (JFETs). IGBTs can be implemented due to their low control power, high blocking voltage, robustness against short circuits and their suitability to be connected in series and/or in parallel.

The switch module can further comprise a housing accommodating all of the switching elements. The first and the second connections and the at least one control connection extend outside the housing. The housing can be a pressure contact housing (e.g., a so-called "press-pack" housing) in which the semiconductor chips are pressed between pressure contact plates. In the case of a gate-emitter short circuit fault in an IGBT, the collector-emitter-short circuit is secured through pressure contact of the semiconductor chip for an intermediate period, i.e., at least in the range of hours or days. The fault protection device is able to secure the short circuit for a longer period, i.e., several months or years. The housing can also be a module-type housing in which the semiconductor chips are bonded. In a fault situation the bond wires of the faulty semiconductor chips can lift off the chip, which can lead to explosion. This process can happen within fractions of a second after chip failure. The fault protection device with its passive protection network is able to act essentially without delay in order to switch non-faulty switching elements to a conducting state or to maintain them in a conducting state.

In an embodiment the fault protection device is a circuit arrangement with passive components. The circuit arrangement is arranged between the at least one control connection and the control electrodes of the switching elements, e.g., between the gate connection and the gate electrodes and can define gate control paths. Some parts of the circuit arrangement can also be arranged between the second connection and the second electrodes of the switching elements, e.g., between the emitter connection and the emitter electrodes.

The fault protection device can comprise a resistance matrix that provides the control voltage to non-faulty switching elements. The control voltage is the voltage applied to the control electrodes (e.g., the gate-emitter voltage) and the resistance matrix is designed such that the control voltage applied to the control electrode of at least some of the non-faulty switching elements is greater than the turn-on threshold voltage ($V_{GE\text{-}th}$) of the switching elements. The control voltage is provided in response to a defined turn-on voltage (or drive voltage $V_{G\text{-}on}$) which is applied to the at least one control connection, e.g., by a drive unit which does not form part of the switch module. The relationship between the turn-on voltage and the control voltage (i.e., between the drive voltage and the gate-emitter voltage) will depend on resistances in the drive unit and on resistances between the control connection and the control electrodes of the switching elements.

The resistance matrix can comprise a plurality of first resistances, each first resistance being electrically connected to the control electrode of a respective switching element.

The first resistances can be provided to ensure substantially simultaneous, equal switching of the switching elements. But if suitably designed to have a suitable resistance, the first resistances of the resistance matrix can additionally provide fault protection functionality.

In particular, the resistance matrix can be designed in such a way that for a given turn-on voltage, which is applied by a drive unit through an external drive resistance to the at least one control connection, the resultant control voltage at the control electrodes of at least some of the non-faulty switching elements exceeds the threshold voltage of the switching element in order to switch non-faulty switching elements to a conducting state or to maintain them in a conducting state.

The resistance matrix can further comprise a plurality of second resistances, each second resistance being electrically connected between the at least one control connection and one or more of the first resistances. In other words, each second resistance can be connected in series with one first resistance or with two or more first resistances. The switching elements electrically connected to a respective second resistance define a group of switching elements as described in more detail below. The first resistances can be arranged integrally with the switching elements (e.g., with the semiconductor chips), whereas the second resistances can be arranged to be separate from the switching elements but positioned within the common housing.

The switch module can comprise a plurality of control connections, each control connection being electrically connected to the control electrode of a respective switching element or to the control electrodes of a respective group of switching elements. The control connections are coupled with a drive unit, which has a corresponding number of parallel drive outputs and drive resistances.

The fault protection device can comprise a plurality of fuses or thermistors, each fuse or thermistor being electrically connected between the at least one control connection and the control electrode of a respective switching element or between the at least one control connection and the control electrodes of a respective group of switching elements. The fuses can be safety fuses or resettable fuses that trigger a separation of the short circuited control electrode of a faulty switching element from the control connection. The thermistors can be positive temperature coefficient (PTC)-resistance elements or PTC-resistors that block the current to the short circuited control electrode of a faulty switching element. The fuses and thermistors are more particularly positioned within the common housing.

The fault protection device can comprise a plurality of capacitors, each capacitor being electrically connected between the at least one control connection and the control electrode of a respective switching element or between the at least one control connection and the control electrodes of a respective group of switching elements. In an embodiment, each capacitor is connected in parallel with a high-impedance bypass resistance. The capacitance of the capacitors may be selected so as not to cause any impermissible variation of the control voltage applied to the switching elements in normal operation, but to block direct current flowing into the control electrode of the faulty switching element in the event of a fault.

The fault protection device can comprise one or more of the resistance matrix (e.g., a plurality of first resistance and optionally a plurality of second resistances), the plurality of fuses, the plurality of thermistors, and the plurality of capacitors as described above in any particular combination.

Embodiments of the present invention further provide a power electronic module comprising a switch module as described above; and a drive unit comprising a power source, a drive output connected to the at least one control connection of the switch module, a drive resistor, and a controllable switch.

When the controllable switch is closed, a defined turn-on voltage (or drive voltage) is applied through the drive resistance to the at least one control connection of the switch element. The power electronic module is suitable for the development of a multi-stage converter and includes short circuit protection functionality in accordance with the present invention.

The drive unit can be configured to detect a failure of at least one of the switching elements and in response to the detection to apply or keep applying a defined turn-on voltage to the at least one control connection. Failure of a switching element can be identified, for example, by monitoring the current and/or voltage of the switching elements or of the switch module as a whole.

The drive unit can comprise a plurality of drive outputs, each drive output being connected to one of a plurality of control connections of the switch module. Each drive output has a respective drive resistor and is configured to apply the same turn-on voltage to all of the control connections via the plurality of drive outputs irrespective of which switching element has failed.

In one arrangement the fault protection device comprises a resistance matrix with first resistances. Each first resistance is connected between a control electrode of a respective switching element and the at least one control connection. The first resistances have substantially the same resistance $R_{int}$ and the following condition is fulfilled:

$$R_{int} > k \times R_{tot}/(V_{G\text{-}on}/V_{GE\text{-}th} - (m-k)/m),$$

where:
$R_{tot}$ is the total effective drive resistance for the switch module in normal operation, which is defined by $R_{tot} = R_G + R_{int}/m$,
$R_G$ is the drive resistance of the drive unit,
$V_{G\text{-}on}$ is the turn-on voltage (or drive voltage) of the drive unit,
$V_{GE\text{-}th}$ is the turn-on threshold voltage of the switching elements,
k is the number of faulty switching elements, e.g., having a gate-emitter short circuit fault, and
m is the total number of switching elements within the switch module.

In another arrangement, the fault protection device comprises a resistance matrix with first resistances connected to the control electrode of each switching element and second resistances, each second resistance being connected between the at least one control connection and one or more of the first resistances. The switching elements being connected to a respective second resistance define a group of switching elements. In case of a fault in a switching element having a corresponding first resistance with resistance $R_{1j}$ and a corresponding second resistance with resistance $R_{2i}$ connected in series with the first resistance the following applies to the turn-on voltage $V_{G\text{-}on}$ to be applied to the control connection to switch the non-faulty switching elements into a conducting state or to maintain them in a conducting state:

$$V_{G\text{-}on} > V_{GE\text{-}th} \times (R_G + R_{2i} + R_{1j})/(R_{2i} + R_{1j}),$$

where $V_{GE\text{-}th}$ is the turn-on threshold voltage of the switching elements, and $R_G$ is a drive resistance of the drive unit.

BRIEF DESCRIPTION OF THE DRAWINGS

Embodiments of the invention are described in detail with the aid of the following drawings, which show exemplary embodiments in accordance with the invention, whereby the same reference numerals are applied in all the drawings in order to designate the same elements.

DETAILED DESCRIPTION

Figure 1:
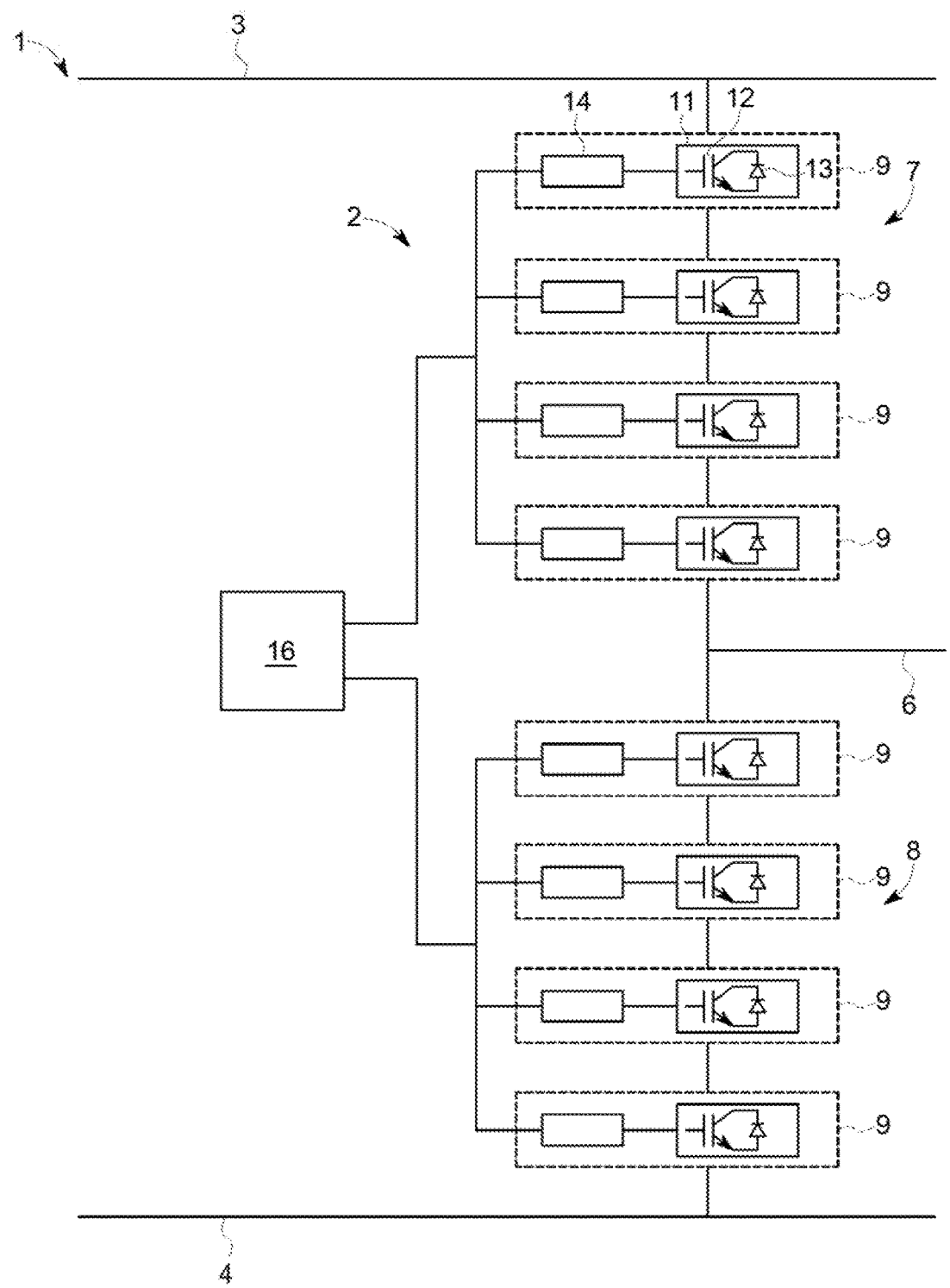
FIG. 1 shows a simplified view of a phase leg of an exemplary converter for illustrating an application of a power electronic module.

FIG. 1 shows in a simplified schematic illustration a phase leg of a high voltage converter 1 for illustrating of an exemplary application of the invention. The converter 1 can be a single phase converter, which converts an input side direct current (DC) into alternating current (AC) on the output side, or a two or multi-phase converter. The converter 1 includes a phase module 2 for each phase of the AC grid to which it is connected. The converter 1 includes two DC connections 3, 4 and an AC connection 6. Branches 7, 8 of the phase module 2 extend respectively between the AC connection 6 and the DC connections 3, 4. Each branch 7, 8 includes a plurality of series-connected sub-modules 9, which are hereinafter referred to as power electronic modules. But alternatively, it is possible that a phase module branch 7, 8 or the converter 1 can be regarded as a power electronic module.

Each power electronic module 9 includes one or more switch modules 11 connected in series or in parallel with a controllable switching element 12, to which a suitable free-wheeling diode 13 can be connected in parallel. Each power electronic module 9 also includes one or more drive units 14, which control the associated switching element 12 to turn it on (i.e., to put it in a conducting state) or turn it off (i.e., to put it in a non-conducting or blocking state). The drive units 14 are in turn suitably controlled by a superior drive unit or controller 16, so that through suitable switching of the switching elements 12 an input DC voltage can be converted in accordance with a predefined scheme and/or through pulse width modulation (PWM) so that a desired output AC voltage is provided at the AC connection 6. Suitable filtering of the output AC voltage can be carried out. By including a plurality of switch modules 11 in each branch 7, 8 of the phase module 2 a higher connected output AC voltage can be achieved.

It is evident that the high voltage converter 1 illustrated here is only an example, and that numerous other converter topologies exist in which the invention can be utilised. For example, the invention can be utilised when cells based on power semiconductor devices, e.g., half-bridge or H-bridge cells, are connected in series as part of a more complex circuit topology.

If a power electronic module 9 in a phase module branch 7, 8 fails, this module should be changed to a conductive short circuit failure mode so that the function of the converter 1 can also be fulfilled through the remaining functionally capable switch modules 11. In particular, it should be ensured that the functionally capable (or non-faulty) components of the converter 1 are not damaged by any exploding parts, and that a continuous low Ohm (or low impedance) current path is achieved through the faulty power electronic module 9. These requirements can be fulfilled by a power electronic module 9 and a switch module 11 in accordance with the invention as described below with reference to FIGS. 2 to 7.

Figure 2:
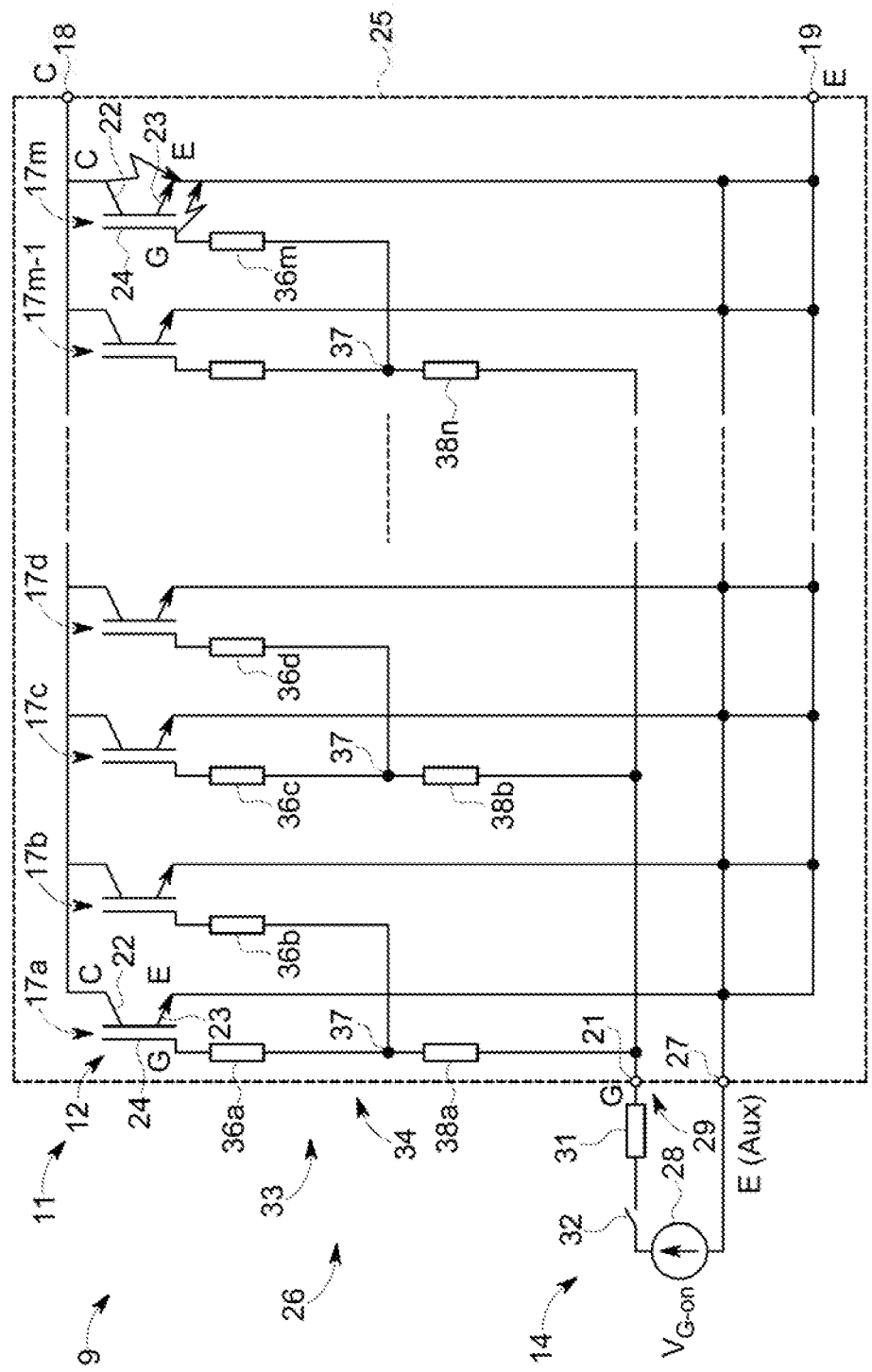
FIG. 2 shows a power electronic module with a first embodiment of a switch module.

FIG. 2 shows a block image of a power electronic module 9, which includes a switch module 11 according to a first embodiment and a drive unit 14. As illustrated, the switch module 11 includes a plurality of switching elements 17a, 17b, 17c, 17d 17m−1, 17m, which are connected in parallel between a first connection 18, a second connection 19, and a control connection 21. The switch module 11 can include any suitable number of switching elements, but typically a minimum of two switching elements are arranged in parallel with each other.

In an embodiment, the switching element 17 may be a power semiconductor device, e.g., an IGBT, MOSFET, JFET or similar controllable power semiconductor switch, which can be switched between a conducting state and a non-conducting (or blocking) state through suitable control. In the Figs., for simplification of the following description, IGBTs are illustrated as the switching elements 17 and the associated free-wheeling diodes are omitted. In the following description the terminology used is appropriate to IGBTs. Thus, the control connection 21 is provided as a gate connection, and the first and second connections 18, 19 are provided as the collector and emitter connections, respectively. However, it is evident that the invention is not limited to the usage of IGBTs and that where other controllable power semiconductor switches are used the appropriate connections will be provided.

In the embodiment with IGBTs shown in FIG. 2, each switching element 17 includes a collector electrode 22 (also labelled C) which is connected to the collector (or first) connection 18, an emitter electrode 23 (also labelled E) which is connected to the emitter (or second) connection 19, and a gate electrode 24 (also labelled G) which is connected with the gate (or control) connection 21.

The switching elements 17 may be accommodated in a common housing 25, for instance, in a pressure contact housing (a so-called press-pack housing), or they are manufactured in a so-called module-type construction and are provided with a common housing 25.

In the embodiment shown in FIG. 2 another connection, an auxiliary emitter connection 27 (also labelled E (Aux)) is connected in the interior of the housing 25 to the emitter connection 19 and serves to decouple the control circuit with the drive unit 14 from the load current. The various connections 18, 19, 21 and 27 extend from the interior of the housing 25 to outside the housing.

In the interior of the housing 25, a fault protection device 26 is provided. The fault protection device 26 ensures the controlled, continuously conducting state of the switch module 11 in case of a fault in a switching element 17. The fault protection device 26 is described in more detail below.

The drive unit 14, which is shown in FIG. 2 in a simplified form, includes an energy source 28, at least one drive output 29, a drive resistance 31, and a controllable switch 32. The drive output 29 is connected to the gate connection 21, the auxiliary emitter connection 27, and the emitter connection 19, respectively. The energy source 28 is shown as a voltage source whose drive voltage $V_{G\text{-}on}$ is applied to the gate connection 21 and used to derive a gate-emitter voltage applied to all of the switching elements 17 simultaneously when the switch 32 is closed. The drive voltage $V_{G\text{-}on}$ is applied to the switching elements 17 (and more particularly, to their gate electrodes 24) through the drive resistance 31 and a resistance network 34 that is described in more detail below.

As explained above, the fault protection device 26 ensures that the switch module 11 can be placed in a controlled, continuously conducting failure mode in case of a fault in one of the switching elements 17. In a conventional switch module, a fault as described herein, in the form of a short circuit of the collector-emitter path of an IGBT results in a short circuit between its gate electrode and its emitter electrode, and is illustrated in FIG. 2 for the switching element 17m. The gate electrodes of other functionally capable switching elements are shorted against the emitter electrode and are no longer controllable. The non-faulty or functionally capable switching elements are thereby deactivated and lose their controllability, and the faulty switching element absorbs the entire load current. Due to the excessive current, the resultant heat and the arc, this can lead to a severe damage of the conventional switch module or other components of the power electronics module. This damage is prevented by the fault protection device 26 in accordance with the invention, which ensures that all or at least some of the functionally capable switching elements are kept in a limited controllable and/or conducting state or are switched to a conducting state through one of the methods described below or a combination of the methods.

The fault protection device 26 in accordance with the invention comprises a circuit arrangement 33, which is accommodated in the interior of the housing 25 together with the switching elements 17. The circuit arrangement 33 uses only passive components, in other words the components do not possess any amplifying effect or control function. More particularly, the circuit arrangement 33 in the embodiment shown in FIG. 2 includes a resistance matrix 34 with a plurality of first resistances 36a, 36b, . . . , 36m where a first connection of each first resistance is connected to the gate electrode 24 of an associated switching element 17. The first resistances 36 are respectively connected in pairs by a second connection to a connection point 37 so that, for example, the first resistances 36a and 36b have second connections that are connected to each other, the first resistances 36c and 36d have second connections that are connected to each other, and the first resistances 36m−1 and 36m have second connections that are connected to each other. The first resistances 36 and the connection points 37 form part of a plurality of gate current paths that are connected between the gate connection 21 and the gate electrode 24 of each switching element 17.

The resistance matrix 34 further includes a plurality of second resistances 38a, 38b, . . . , 38n. Each second resistance 38 is connected between an associated connection point 37 of the first resistances 36 and the common gate connection 21. The second resistances 38 form part of the gate current paths. In the embodiment shown in FIG. 2, m=2n and two resistances 36 are connected together at a respective connection point 37 to define a group, with each group being connected to a respective second resistance 38. In other embodiments, three or more first resistances 36 can be connected together to form a group, with each group being connected to a respective second resistance. In this case m=3n or m=in where i is an integer greater than 3. The switching elements 17 that are connected to the first resistances 36 in a particular group also form a group of switching elements 17. In the embodiment shown in FIG. 2, switching elements 17a and 17b form a group, switching elements 17c and 17d form a group, . . . and switching elements 17m−1 and 17m form a group.

Although this is not shown in detail in FIG. 2, the first resistances 36 of the resistance matrix 34 can be arranged integrally with the switching elements 17 (e.g., on the semiconductor chip or die), or they can also be arranged separately from the switching elements 17 but within the housing 25. The first resistances 36 can be used to balance the switching, in order to ensure that all of the switching elements 17 are activated substantially simultaneously and equally as far as possible when controlled by the drive unit 14. Generally, these types of balancing resistances are of relatively low Ohm (or impedance). The second resistances 38 can also be arranged integrally with the switching elements 17 but they are normally arranged separately from the switching elements 17 but within the housing 25.

The power electronic module 9 described so far with the fault protection device 26 functions as follows:

In normal operation, the drive unit 14 controls all of the switching elements 17 to switch, substantially simultaneously, between conducting and non-conducting states so as to switch the switch module 11 between conducting and non-conducting states.

If one of the switching elements fails and its gate-emitter path is short circuited, with the aid of the resistance matrix 34, the fault protection device 26 it is still possible to activate functionally capable or non-faulty switching elements 17 through the application of a sufficient drive voltage $V_{G\text{-}on}$ so that the gate-emitter voltage that is applied to at least some of the switching elements 17 exceeds their threshold voltage value $V_{GE\text{-}th}$.

Under the assumption that a fault occurs in a jth switching element of the switch module 11 (e.g., switching element 17m, as shown in FIG. 2), the condition of the necessary drive voltage is as follows:

$$V_{G\text{-}on} > V_{GE\text{-}th} \times (R_G + R_{2i} + R_{1j})/(R_{2i} + R_{1j}) \quad \text{(Eq. 1)}$$

where, $V_{GE\text{-}th}$ is the threshold voltage for the switching elements, $R_G$ is the electrical resistance of the drive resistance 31, $R_{1j}$ is the electrical resistance of the first resistance $36_j$ associated with the jth switching element, and $R_{2i}$ is the electrical resistance of the second resistance $38_i$ connected to the first resistance $36_j$.

So in this example, a gate-emitter voltage exceeding the threshold voltage value $V_{GE\text{-}th}$ is applied to the switching elements 17 not belonging to the group that includes the faulty switching element $17_j$ so that these non-faulted or functionally capable switching elements are switched to a conducting state or kept in a conducting state. A lower gate-emitter voltage will be applied to the non-faulty or functionally capable switching elements belonging to the group that includes the faulty switching element $17_j$ and this lower gate-emitter voltage would not necessarily exceed the threshold voltage value $V_{GE\text{-}th}$. This means that any non-faulty switching elements belonging to the group that includes the faulty switching element 17j are not necessarily switched to a conducting state or kept in a conducting state. In other examples, the drive voltage $V_{G\text{-}on}$ can be sufficient for the gate-emitter voltage applied to all of the non-faulty or functionally capable switching elements (including those belonging to the same group as the faulty switching element) to exceed the threshold voltage $V_{GE\text{-}th}$ such that all non-faulty switching elements are switched to a conducting state or kept in a conducting state.

It will be understood that a fault can occur in one of the switching elements 17 or in two or more of the switching elements and still functionally capable switching elements can be switched to a conducting state or kept in a conducting state through the application of sufficient drive voltage $V_{G\text{-}on}$. It should be noted that equation (Eq. 1) is applicable only for the special case with a single faulty switching element, but that the skilled person can derive corresponding relationships for the necessary drive voltage $V_{G-on}$ in the case of two or more faulty switching elements or for other faults. In general, the drive voltage $V_{G-on}$ must be such that the gate-emitter voltage applied to at least some of the non-faulty switching elements 17 exceeds the threshold voltage $V_{GE-th}$.

As an example, with a threshold voltage $V_{GE-th}$ of about 10 volts, in accordance with each defined value for the first and second resistances 36, 38 and the drive resistance 31, a drive voltage $V_{G-on}$ in the range of about 15 to about 50 volts can be necessary. However, this depends on the inner resistance matrix of the switch module 11 between the gate connection 21 and the gate electrodes 24 of the switching elements 17.

If a fault, especially a short circuit, is identified between the collector connection 18 and the emitter connection 19 of a switching element 17 of the switch module 11, a predefined drive voltage $V_{G-on}$ can be applied to the gate connection 21 which is so large that, depending on the impedances of the resistance matrix 34, at least some of the functionally capable switching elements can be switched to a conducting state or kept in a conducting state. Also, the first and second resistances 36, 38, depending on a predefined drive voltage $V_{G-on}$ can be designed or selected for a failure event.

Thus, the suitably designed resistance matrix 34, through application of a sufficient drive voltage defined in advance, provides the gate electrodes 24 of functionally capable switching elements 17 with a sufficient gate-emitter voltage in case of a fault in one or more switching elements 17 so that these can be switched to a conducting state or kept in a conducting state, whereas the gate electrodes 24 of the one or more faulty switching elements, which are connected to the same resistance matrix 34, are short circuited. Therefore, the switching elements 17 remain controllable and can be continuously kept in a conducting state.

By recording or detecting the fault, for instance, through monitoring of voltages and currents in the connections 18, 19, 21 and 27 of the switch module 11 and by quick or continued control of the switching elements 17, the load current can be distributed to all the switching elements such that a development of an electric arc or explosions is avoided. Measures for protection against explosion, e.g., a housing with explosion protection or overvoltage protection devices, can be reduced. Besides, a continuous and stable low Ohm (or low impedance) current path is created by the faulty switch module. More particularly, the protection provided through the fault protection device 26 is achieved only with passive elements, namely the resistance matrix 34, and in a purely passive manner. For this no active logic, active switches or the like are necessary in order to identify the fault source and/or to isolate, to change or divert the current path and to specifically activate only the functionally capable switching elements 17.

Figure 3:
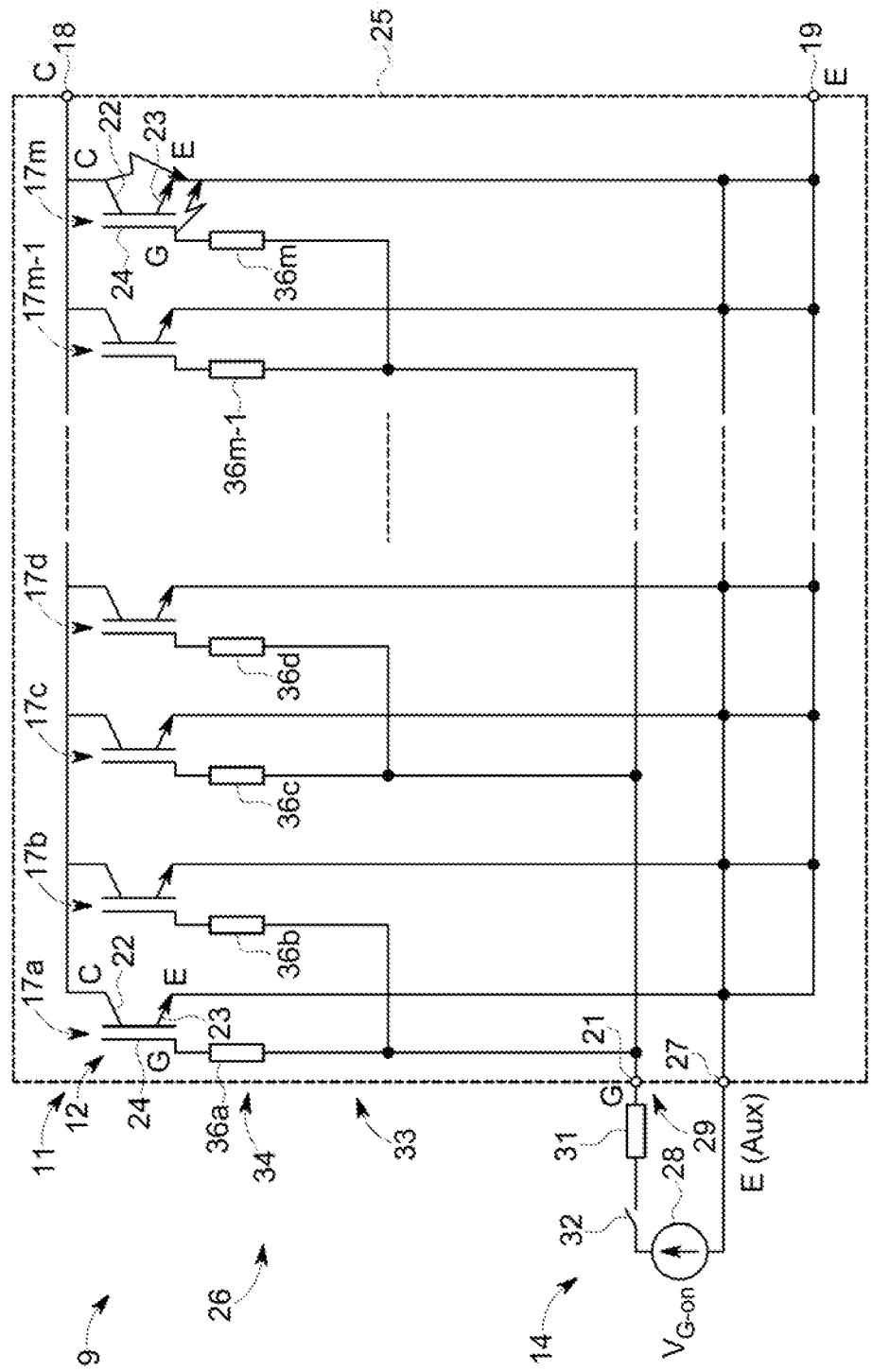
FIG. 3 shows a power electronic module with a second embodiment of a switch module.

FIG. 3 shows a power electronic module 9, which includes a switch module 11 according to a second embodiment. The switch module 11 is similar to the switch module shown in FIG. 2 but the second resistances 38 have been omitted so that the first resistances 36 are connected through the connection points 37 directly to the gate connection 21.

Through suitable design of the resistance matrix 34 it can be ensured that, for a given drive voltage $V_{G-on}$, which is applied by the drive unit 14 through a drive resistance 31 to the connections 19, 21 of the switch module 11, the gate-emitter voltage at the gate electrodes 24 of functionally capable, non-faulty switching elements 17 is greater than the threshold voltage $V_{GE-th}$.

As an example, for the switch module 11 shown in FIG. 3, under the assumption that the electrical resistances of the first resistances 36 between the gate connection 21 and the gate electrodes 24 are substantially equal, i.e., so $R_{int}=R_{11}=R_{12}=\ldots=R_{1m}$, the following condition must be fulfilled:

$$R_{int} > k \times R_{tot}/(V_{G-on}/V_{GE-th}-(m-k)/m), \quad \text{(Eq. 2)}$$

where $R_{tot}$ is the entire effective gate resistance for the switch module 11 in normal operation, which is defined by:

$$R_{tot}=R_G+R_{int}/m, \quad \text{(Eq. 3)}$$

where m is the total number of switching elements 17 in the switch module 11, k is the number of faulty switching elements with gate-emitter short circuit, $V_{G-on}$ is the gate drive voltage of the drive unit 14, and $V_{GE-th}$ is the gate-emitter threshold voltage of the switching elements 17.

Again, through the suitable design of the resistance matrix 34 in accordance with equations (Eq. 2) and (Eq. 3), it is possible, in spite of short circuited gate-emitter paths of one or more faulty switching elements 17 to activate other functionally capable switching elements (i.e., to switch them to a conducting state) or to keep them in a conducting state through the application of a drive voltage $V_{G-on}$ defined in advance, and which can be identical with the drive voltage in normal operation. This is again achieved in a purely passive manner, without any active logic, active switch or the like, to identify the faulty point and/or to isolate and to specifically activate only the functionally capable switching elements, and with the previously explained other advantages of protection against explosions and electric arcs and a low Ohm (or low impedance) permanent current path through the faulty switch module.

Figure 4:
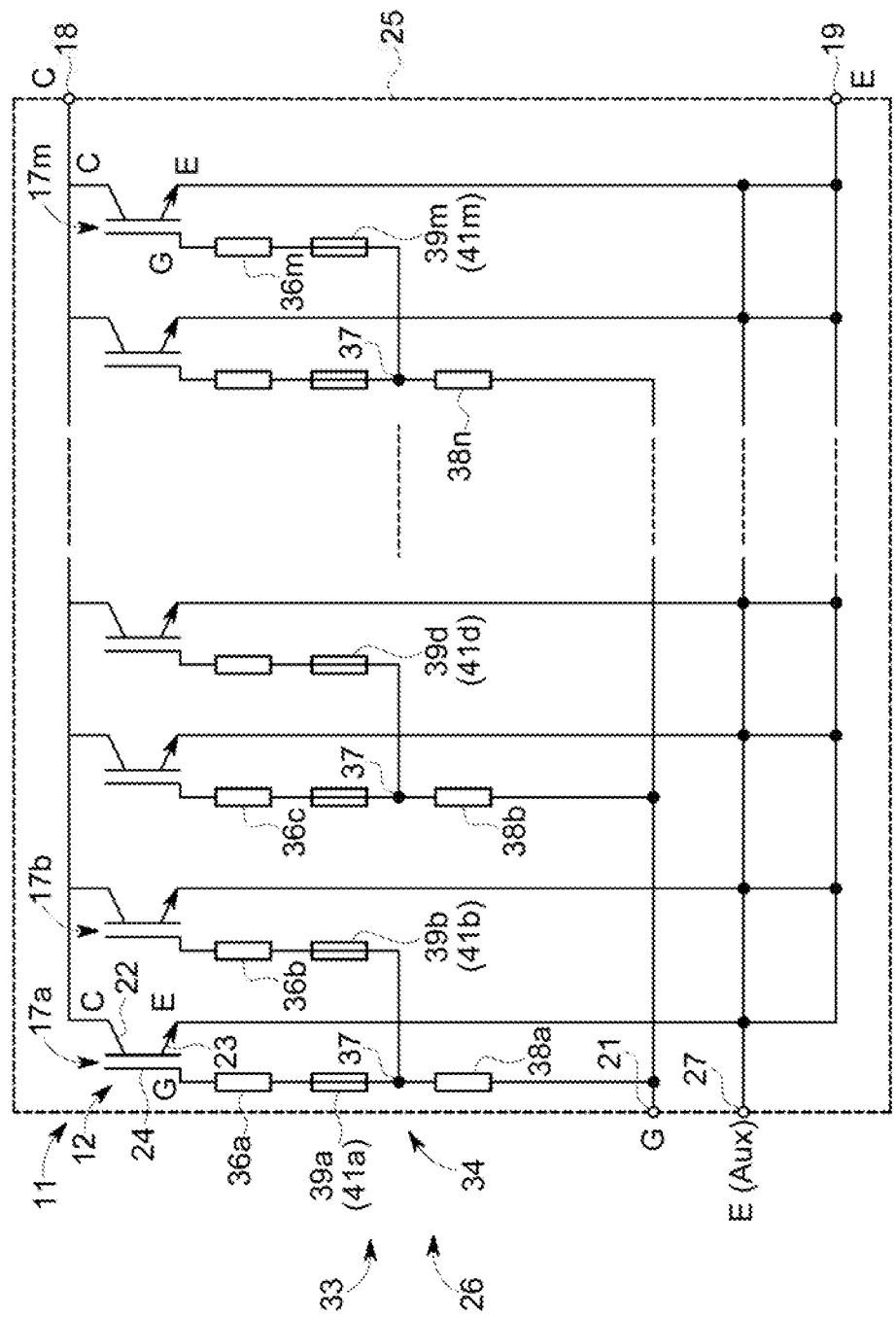
FIG. 4 shows a power electronic module with a third embodiment of a switch module.

FIG. 4 shows a switch module 11 according to a third embodiment. The switch module 11 is similar to the switch module shown in FIG. 2 but a fuse 39a, 39b, . . . , 39n is provided in each gate current path between the gate electrode 24 of each switching element 17 and the respective connecting point 37 for the group of switching elements. As shown in FIG. 4, each fuse 39 is connected between a first resistance 36 and the connecting point 17 for the group of switching elements. The fuses 39 can be safety fuses or resettable fuses, and depending on the resistance matrix 34, are designed or selected in such a way that they trigger in the event of a fault in order to separate the short-circuited gate electrode 24 of a faulty switching element 17 from the gate connection 21, whereas the other fuses associated with the non-faulty switching elements 17 are not affected.

In cases of a short-circuited gate structure of a faulty switching element, the resultant gate current, which is fed with the application of a positive gate signal through the drive unit 14 into the short-circuited gate structure, is much higher than during normal operational conditions, because, in the case of voltage controlled semiconductor devices like IGBTs, under normal operational conditions only short term currents flow in the gate connection during charging and discharging of the chip-internal gate capacity of the semiconductor devices during their turn-on and turn-off transients. The fuses 39 can therefore be designed or selected in order to separate the short-circuited gate electrode 24 from the drive unit 14 at the elevated gate current level of a short-circuited gate structure, through which the control of the functionally capable, non-faulty gate structures is enabled, i.e., to turn them on or to keep them turned on. The fuses 39 can be based on SMD technology and are integrated together with the first and/or second resistances 36, 38 either with the switching elements 17 or outside the switching elements but within the common housing 25. The fuses 39 enable quick reaction, which effectively avoids damage due to explosions and electric arcs.

Figure 5:
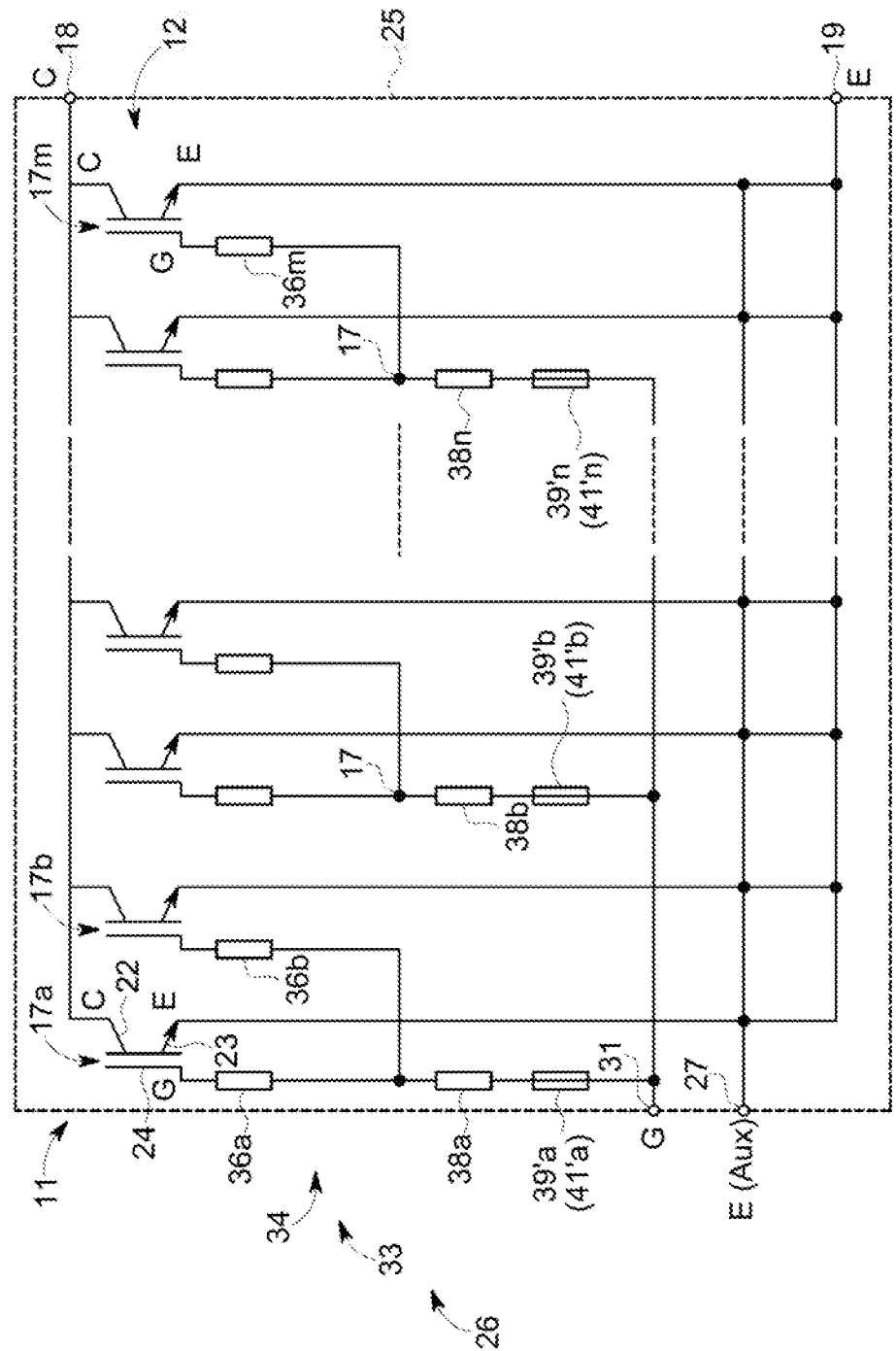
FIG. 5 shows a power electronic module with a fourth embodiment of a switch module.

FIG. 5 shows a slight modification to the embodiment shown in FIG. 4, where the fuses 39'*a*, 39'*b*, . . . , 39'*n* are arranged in the gate current paths between the gate connection 21 and the connection point 37 of the respective groups of switching elements 17 and in series with the second resistances 38. Again, the safety fuses 39' can be set up in order to trigger in case of a fault, but it is to be taken into account that each fuse 39' conducts twice the current in normal operation (or multiples of current, if more than two switching elements 17 are connected to a group) as the fuses 39 shown in FIG. 4.

Alternatively, in the embodiments shown in FIGS. 4 and 5, instead of the fuses 39 or 39' so-called PTC-resistance elements 41*a*, 41*b*, . . . , 41*m* (FIG. 4) and 41'*a*, 41'*b*, . . . , 41'*n* (FIG. 5) can be provided. These PTC-resistance elements 41, 41' can conduct current better at low temperatures than at high temperatures. In other words, PTC-resistance elements 41, 41' are components whose electrical resistance increases with increasing temperature. In case of one or more faulty switching elements 17, the gate drive current, which flows from the drive unit 14 into the short-circuited gate structure with the application of a positive gate drive signal, is much higher than under normal operational conditions. The PTC-resistance elements 41, 41' are suitably placed in order to warm up sufficiently at these higher current levels in order to set up a high resistance in the gate current path between the gate drive unit 14 and the short-circuited gate electrode 24 so as to block the gate drive current or to reduce it, through which a control of the other, functionally capable gate structures is enabled.

Although here the connection between the drive unit 14 and the short-circuited gate electrode 24 of a faulty switching element 17 is not fully separated, as in the case of the fuses 39, 39' shown in FIGS. 4 and 5, the gate drive current is clearly reduced and the functionality of the fault protection device 26 with the PTC-resistance elements 41, 41' is similar to that of the fault protection device 26 with fuses.

Figure 6:
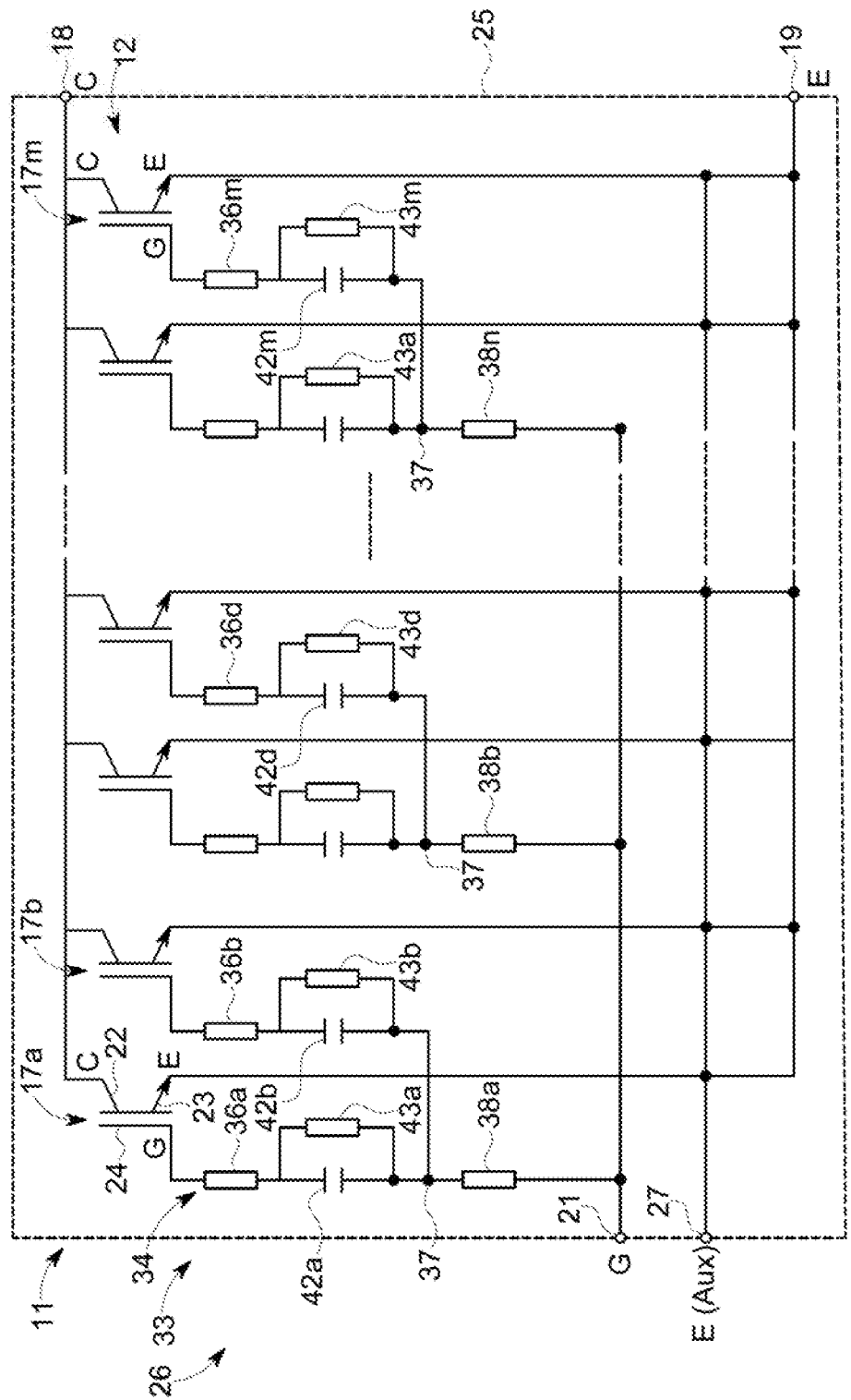
FIG. 6 shows a power electronic module with a fifth embodiment of a switch module.

FIG. 6 shows another modified embodiment of a switch module 11 with a fault protection device 26. Here, a series capacitor 42*a*, 42*a*, . . . , 42*m* is arranged in each gate current path between the gate electrode 24 of each switching element 17 and the respective connecting point 37 for the group of switching elements. In FIG. 6 each series capacitor 42 is connected between a first resistance 36 and the connection point 37. A high Ohm (or high impedance) resistance 43*a*, 43*b*, . . . , 43*m* is connected in parallel with each series capacitor 42 to form a bypass current path for the respective series capacitor 42. The series capacitors 42 are designed or selected in such a way that they do not cause any impermissible deviation of the gate drive voltage of the switching elements 17 in normal operation.

In normal operation, the gate-emitter and the gate-collector capacitances of the switching elements 17 are alternatively charged or discharged through the application of gate drive current, which is an alternating current in accordance with the pulse pattern. Each direct current component in the gate drive current arises from parasitic effects and is negligibly small. This direct current part is absorbed through the high Ohm (or high impedance) bypass resistances 43. The series capacitors 42 are to be designed or selected to have a capacitance greater than the gate-emitter capacitance of the switching elements 17 so that in normal operation only a small fraction of the voltage is taken by the series capacitors 42.

In case of a short circuit, when the gate-emitter capacitance of a faulty switching element 17 is shorted, the associated series capacitor 42 is quickly charged to the gate drive voltage such that it blocks the direct current to the short-circuited gate structure. A sufficient gate-emitter voltage is automatically applied to the gate electrodes 24 of non-faulty switching elements 17 and these are conductively activated or maintained.

With the aid of a circuit arrangement 33, which contains only passive components, in the case of a short circuit failure, the other functionally capable (or non-faulty) switching elements automatically remain controllable in a stable conducting status in a purely passive manner, without requiring an active logic, active switch or similar for this purpose, in order to identify the fault position and/or to isolate and to specifically activate the non-faulty switching elements only. A continuous, stable low Ohm (or low impedance) current path is created through the switch module 11 and the voltage through the faulty switching elements is minimized so that the danger due to explosion and electric arcs is avoided or clearly reduced.

In a modification, the series capacitors 42 and the bypass resistances 43 can also be arranged in series with the second resistances 38 in the gate current path between the connection points 37 and the gate connection 21.

Figure 7:
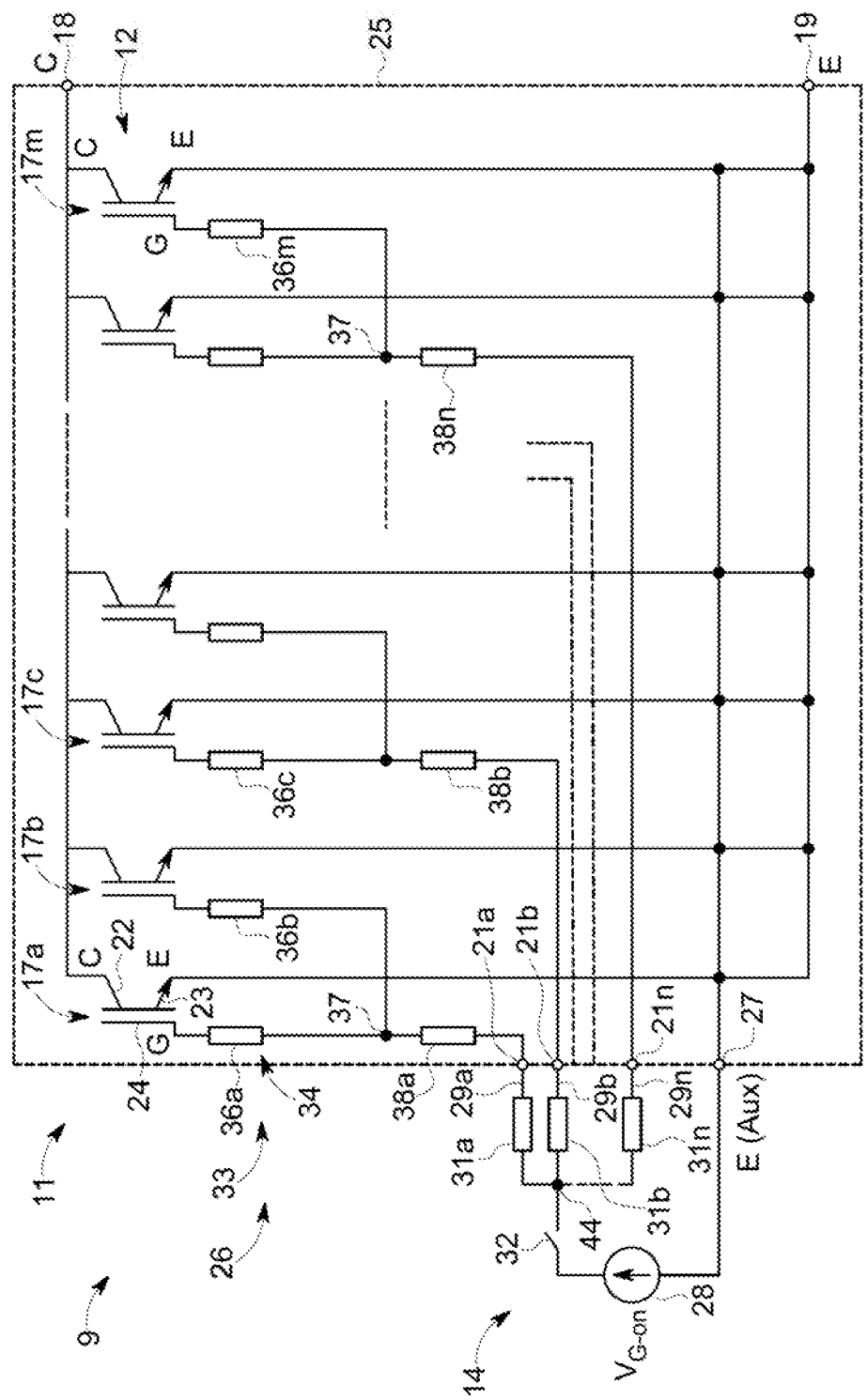
FIG. 7 shows a power electronic module with an alternative drive unit.

FIG. 7 shows another embodiment of a power electronic module 9 according to the invention with a modified switch module 11 and a modified drive unit 14. The switch module 11 according to FIG. 7 differs from the previous embodiments in that it includes a plurality of gate connections 21*a*, 21*b*, . . . , 21*n* leading out of the common housing 25, each gate connection being associated with a group of switching elements 17. Alternatively, each switching element 17 can be associated with its own gate connection. As discussed above, each group can include any number of switching elements 17 not just two switching elements as shown in FIG. 7.

The common auxiliary emitter connection 27 can be common for all of the switching elements 17 or a plurality of auxiliary emitter connections 27 can be provided, each auxiliary emitter connection being associated with an emitter electrode 23.

The drive unit 14 includes a plurality of parallel drive outputs 29*a*, 29*b*, . . . , 29*n*, which are connected with the gate connections 21 of the switch module 11. Each drive output 29 includes a drive resistance 31*a*, 31*b*, . . . , 31*n*. The drive resistances 31 are connected between an associated drive output 29 and a star point 44. The star point 44 is connected to the power source 28 by means of the controllable switch 32. The drive resistances 31 can have the same electrical resistances.

The gate connections 21 of the switching elements 17 or the switching element groups permit the control of functionally capable switching elements and/or groups, without requiring any active logic, active switch or the like, in order to identify the fault point and/or to isolate and to specifically turn on the functionally capable switching elements only.

Rather, the drive unit 14 can control all the gate connections 21 simultaneously such that at the star point 44, due to parallel drive resistances 31, a relatively high voltage level can be obtained in spite of the short circuit at the faulty switching element. So unlike the situation with a common gate connection, the non-faulty switching elements are sufficiently loaded and remain controllable. Finally, these non-faulty switching elements and/or groups respectively receive a sufficient gate-emitter voltage above the threshold voltage of the IGBTs, for example, so that they are actively turned on/or maintained as such. The drive unit 14 can be designed as a whole in such a way that it is in a position to feed short circuit current in the individual, short circuited gate electrode 24, which is possible as the individual second resistances 38 are, like the drive resistances 31, of high Ohm (or high impedance), e.g., 20 to 100 Ohm, and define the typical gate drive resistance from 0.5 to 10 Ohm only in their parallel connection. Alternatively, the individual channels of the drive unit 14 can be designed as being short circuit proof in such a way that they enter a high Ohm status in case of a short circuit or excess load and thus limit the gate current considerably. For this, the measures described for passive decoupling of fault positions inside the switch module, e.g., usage of fuses, PTC-resistances or series capacitors can be specifically applied for the channels of the drive unit.

Again, fault protection without an active process for locating the fault positions and/or isolation of faulty switching elements in order to be able to activate the parallel switching elements is provided. Rather, only suitably arranged and dimensioned passive components of the fault protection device 26 are applied, which enable activation and maintenance of conduction of parallel switching elements through a single drive unit 14. This is associated with a switching arrangement of simple construction, with lower complexity and lower costs both in production and operation.

As will be readily understood, the fault protection methods mentioned above can also be combined with other methods, in order to create further possible embodiments. Besides, further modifications and changes can occur to experts, which are within the scope of protection of the attached claims. For instance, different resistance matrices are arranged between or to the gate connection 21 and the gate electrodes 24, in order to take care of the balancing of the switching elements 17 and the fulfilment of fault protection function as per the invention. For instance, the resistance matrix can present more than two levels of resistances (e.g., as represented by the first and second resistances 36 and 38 shown in FIG. 2).

As explained already, the switching elements 17 can also be other power semiconductor devices, e.g., MOSFETs or the like and can be arranged as parallel connected devices in a press-pack housing or in modular construction in a common housing 25 together with fault protection device 26. The switch module 11 and the power electronic module 9 in accordance with the invention can be used for multiple applications, e.g., HVDC or drive applications, in which redundancy requirements are to be fulfilled, for different topologies of converters and other systems and applications in which a controllable semiconductor device, e.g., an IGBT, MOSFET or similar devices must take up a secure conducting status after a fault has occurred. The power electronic module 9 and the switch module 11 provide long term stability after a fault by avoiding additional components and measures, and avoid destruction caused by an explosion. The invention is suitable also for topologies, more particularly those with current source characteristics.

An advantage of the proposed method is that long term stability for an unlimited period can be ensured, as the switching elements are operated in a normal, specified conducting operation. Also no compromise is needed between long term stability in failure cases and designed load and power cycling capability of the devices, as in the case of some conventional devices. The reduced complexity of the fault protection device 26 forms the basis for long maintenance intervals and the associated lower costs as well as for high reliability of the system in operation.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A switch module comprising:
a first connection, a second connection, and at least one control connection;
a plurality of parallel connected switching elements each having a first electrode electrically connected to the first connection, a second electrode electrically connected to the second connection, and a control electrode electrically connected to the at least one control connection; and
a fault protection device operatively electrically connected between the at least one control connection and the switching elements, wherein the fault protection device comprises passive electrical components which are selected such that in the event of a fault in at least one of the plurality of switching elements, a control voltage is provided to the control electrodes of non-faulty switching elements in a passive manner, which control voltage is sufficient to switch at least some of the non-faulty switching elements to a conducting state or to maintain them in a conducting state;
wherein the fault protection device comprises a resistance matrix that provides the control voltage to the control electrodes of the non-faulty switching elements, wherein the control voltage is greater than the turn-on threshold voltage of the switching elements and is provided in response to a defined turn-on voltage which is applied to the at least one control connection.

2. A switch module according to claim 1, wherein the switching elements are power semiconductor devices.

3. A switch module according to claim 1, further comprising a housing accommodating all of the switching elements, wherein the first and the second connections and the at least one control connection extend outside the housing.

4. A switch module according to claim 1, wherein the resistance matrix comprises a plurality of first resistances, each first resistance being electrically connected to the control electrode of a respective switching element.

5. A switch module according to claim 1, wherein the resistance matrix further comprises a plurality of second resistances, each second resistance being electrically connected between the control connection and one or more of the first resistances, wherein the switching elements electrically connected to a respective second resistance define a group of switching elements.

6. A switch module according to claim 1, comprising a plurality of control connections, each control connection being electrically connected to the control electrode of a respective switching element or to the control electrodes of a respective group of switching elements.

7. A switch module according to claim 1, wherein the fault protection device comprises a plurality of fuses or thermistors, each fuse or thermistor being electrically connected between the at least one control connection and the control electrode of a respective switching element or between the at least one control connection and the control electrodes of a respective group of switching elements.

8. A switch module according to claim 1, wherein the fault protection device comprises a plurality of capacitors, each capacitor being electrically connected between the at least one control connection and the control electrode of a respective switching element or between the at least one control connection and the control electrodes of a respective group of switching elements, wherein each capacitor is connected in parallel with a high-impedance bypass resistance.

9. A switch module according to claim 8, wherein the capacitance of the capacitors is selected so as not to cause any impermissible variation of the control voltage applied to the switching elements in normal operation, but to block direct current flowing into the control electrode of the faulty switching element in the event of a fault.

10. A power electronic module comprising:
    a switch module according to claim 1; and
    a drive unit comprising a power source, a drive output connected to the at least one control connection of the switch module, a drive resistor, and a controllable switch.

11. A power electronic module according to claim 10, wherein the drive unit is configured to detect a failure of at least one of the switching elements and in response to the detection to apply or keep applying a defined turn-on voltage to the at least one control connection.

12. A power electronic module according to claim 10, wherein the drive unit comprises a plurality of drive outputs, each drive output being connected to one of a plurality of control connections of the switch module, wherein each drive output has a respective drive resistor and is configured to apply the same turn-on to all of the control connections via the plurality of drive outputs irrespective of which switching element has failed.

13. A power electronic module according to claim 10, wherein the fault protection device comprises a resistance matrix with first resistances, wherein each first resistance is connected between a control electrode of a respective switching element and the at least one control connection, wherein the first resistances have substantially the same resistance $R_{int}$, and wherein the following condition is fulfilled:

$$R_{int} > k \times R_{tot}/(V_{G\text{-}on}/V_{GE\text{-}th} - (m-k)/m),$$

where:
$R_{tot}$ is the total effective drive resistance for the switch module in normal operation, which is defined by $R_{tot} = R_G + R_{int}/m$,
$R_G$ is the drive resistance of the drive unit,
$V_{G\text{-}on}$ is the turn-on voltage of the drive unit,
$V_{GE\text{-}th}$ is the turn-on threshold voltage of the switching elements,
k is the number of faulty switching elements, and
m is the total number of switching elements within the switch module.

14. A power semiconductor module according to claim 10, wherein the fault protection device comprises a resistance matrix with first resistances connected to the control electrode of each switching element and second resistances, each second resistance being connected between the at least one control connection and one or more of the first resistances, wherein the switching elements connected to a respective second resistance define a group of switching elements, wherein in case of a fault in a switching element having a corresponding first resistance with resistance $R_{1j}$ and a corresponding second resistance with resistance $R_{2i}$ connected in series with the first resistance the following applies to the turn-on voltage $V_{G\text{-}on}$ to be applied to the control connection to switch the non-faulty switching elements into a conducting state or to maintain them in a conducting state:

$$V_{G\text{-}on} > V_{GE\text{-}th} \times (R_G + R_{2i} + R_{1j})/(R_{2i} + R_{1j}),$$

where $V_{GE\text{-}th}$ is the turn-on threshold voltage of the switching elements, and $R_G$ is a drive resistance of the drive unit.

* * * * *